United States Patent
Patel et al.

(10) Patent No.: US 8,068,524 B1
(45) Date of Patent: Nov. 29, 2011

(54) SUBMOUNTS FOR SEMICONDUCTOR LASERS

(75) Inventors: C. Kumar N. Patel, Los Angeles, CA (US); Arkadiy Lyakh, Marina del Ray, CA (US); Alexei Tsekoun, Los Angeles, CA (US); Richard Maulini, Los Angeles, CA (US)

(73) Assignee: Pranalytica, Inc., Santa Monica, CA (US)

( * ) Notice: Subject to any disclaimer, the term of this patent is extended or adjusted under 35 U.S.C. 154(b) by 0 days.

(21) Appl. No.: 12/980,164

(22) Filed: Dec. 28, 2010

Related U.S. Application Data

(60) Provisional application No. 61/284,778, filed on Dec. 28, 2009.

(51) Int. Cl.
*H01S 3/04* (2006.01)
(52) U.S. Cl. ............................................. 372/34; 372/36
(58) Field of Classification Search .................... 372/34, 372/36; 257/705, 731
See application file for complete search history.

*Primary Examiner* — Armando Rodriguez
(74) *Attorney, Agent, or Firm* — Cislo & Thomas, LLP

(57) ABSTRACT

A submount for a semiconductor laser. The submount has a layer of silicon carbide (SiC) and a layer of aluminum nitride (AlN) deposited on the layer of SiC. The submount is bonded to the InP-based laser by a hard solder applied to the AlN layer. Preferably, the thickness of the AlN layer is ten to twenty microns, the thickness of the SiC layer is two hundred fifty microns, and the solder is a gold-tin (AuSn) eutectic. The semiconductor laser may be a quantum cascade laser (QCL). Similar combinations of submount materials can be found for other semiconductor laser material systems and types.

22 Claims, 1 Drawing Sheet

SUBMOUNTS FOR SEMICONDUCTOR LASERS

CROSS-REFERENCES TO RELATED APPLICATIONS

This patent application claims the benefit of U.S. Provisional Patent Application Ser. No. 61/284,778 filed Dec. 28, 2009 for Submounts for InP-based Semiconductor Lasers, and that application is incorporated here by this reference.

TECHNICAL FIELD

This invention relates to submounts for semiconductor lasers.

BACKGROUND ART

High power semiconductor lasers, because of their small physical dimensions and high electrical power input, require special thermal management considerations. In addition to effectively extracting the waste heat (net of electrical power input and optical power output) from the active semiconductor laser region, considerable attention needs to be paid to ex-chip thermal management. The waste heat needs to be removed from the semiconductor laser mounting surface efficiently so that the active region of the laser remains at the proper operating temperature. Typical semiconductor laser package assembly involves bonding of the laser to a submount (substrate material) that, in turn, is mounted on a heat spreader or a heat sink.

Three critical parameters need to be considered when choosing the substrate (submount) on to which the semiconductor laser chip is mounted. The first is the thermal conductivity of the submount, which needs to be as high as possible to remove the heat efficiently from the laser. The second is the coefficient of thermal expansion (CTE) of the submount with respect to the coefficient of thermal expansion of the semiconductor laser material. The CTE of the submount must be close to that of the laser to minimize mechanical stress in the laser chip during large temperature cycles, both during the operation of the laser but also during the mounting process which, for reliability purposes, typically uses AuSn eutectic or other hard solder. Third, it is inconvenient to mount the chips directly onto heat spreaders and heat sinks because the heat spreaders are usually bulky. Furthermore, it is much easier to do proper metallization for laser interconnections on a compact submount wafer that is subsequently diced into individual submounts.

One of the most widely employed and technologically important submount materials for InP-based semiconductor lasers is aluminum nitride (AlN). Its CTE, being $4.5 \times 10^{-6}$ $K^{-1}$, is perfectly matched to that of indium phosphide (InP) at room temperature, essentially eliminating thermally induced mechanical stresses on the laser structure, both those frozen-in after die mounting and those arising from thermal cycling during device operation. In addition, high-grade AlN exhibits high thermal conductivity of ~200 W/mK at room temperature. This value is three times higher than thermal conductivity of InP (70 W/mK), which naturally enhances heat transfer from the laser active region into the heatsink. Finally, AlN is an electrical insulator, and hence it permits easy formation of electrical interconnects on the submount for incorporating various passive monitoring elements into the integrated chip on carrier assembly. Due to the advantages listed above, AlN is one of the most widely used materials for semiconductor laser submounts. Similar combinations of submount materials and semiconductor laser materials can be found for other situations.

However, even though AlN has a relatively high thermal conductivity, higher laser performance can be achieved employing submount materials with even higher thermal conductivity. This is especially true for high-power continuous-wave quantum cascade lasers (QCLs) that generate up 30 W of waste heat, from a surface area typically 200 µm wide and 5-7 mm long, and whose performance deteriorates rapidly as the active region temperature rises.

Diamond has the highest known thermal conductivity (>1800 W/mK) of all natural materials, exceeding that for AlN by more than a factor of nine. Therefore, employment of diamond submounts is expected to significantly reduce laser active region temperature under the same laser driving conditions. However, the CTE of diamond at room temperature is $\sim 1 \times 10^{-6}$ $K^{-1}$. Thus, the CTE mismatch between InP and diamond is very large. So, to avoid the undesirable mechanical stress, it is necessary to use soft solders, such as indium, for laser bonding. Soft solders suffer from electromigration from the bonding area to the laser facets, which eventually leads to electrical shorts, facet damage, and eventual laser destruction. This significantly reduces laser reliability. Therefore, diamond is rarely used as a submount material for commercial semiconductor laser applications.

We identified another material that is significantly superior to AlN for high heat waste applications, namely silicon carbide (SiC). SiC has a thermal conductivity of up to 600 W/mK, three times that for AlN. As with AlN it can be made semi-insulating, which facilitates all the electrical interconnects. In addition, its CTE mismatch with InP can be less than $1.0 \times 10^{-6}$ by proper choice of orientation and structure of SiC. It is worth noting that this mismatch is almost a factor of five smaller than that of InP on diamond. But even this relatively small CTE mismatch can still lead to reduced laser reliability, especially when the final assembly undergoes large thermal cycles during packaging and subsequent laser operation.

DISCLOSURE OF INVENTION

Consequently, one purpose of this invention is to overcome the problem of the CTE mismatch between SiC and InP.

In one aspect, the invention comprises a submount for a semiconductor laser. The submount has a layer of silicon carbide (SiC) and a layer of aluminum nitride (AlN) deposited on the layer of SiC. The submount is bonded to the semiconductor laser by a solder applied to the AlN layer. The thickness of the MN layer should be sufficient to suppress the residual CTE mismatch caused strain from being transmitted to the laser. Preferably, the thickness of the AlN layer is up to twenty-five microns. The thickness of the SiC layer should be such that it provides sufficient mechanical support for the laser consistent with minimum thermal resistance. Preferably, the thickness of the SiC layer is two hundred fifty microns, and the solder is a gold-tin (AuSn) eutectic. However, the SiC layer could be thinner or thicker than two hundred fifty microns. The semiconductor laser may be an InP-based laser, and it may be a quantum cascade laser (QCL).

Similar combinations of CTE matching layer material and underlying high thermal conductivity material may be found for other semiconductor laser material systems.

BEST MODE FOR CARRYING OUT THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

As mentioned above, AlN has the same CTE as InP. We discovered that AlN can be used as a thin buffer layer 100 between the SiC wafer 102 and the InP laser 104 for the purpose of absorbing mechanical stress caused by the residual CTE mismatch between the two materials, InP and SiC. The thickness of the AlN layer should be sufficient to suppress the residual strain caused by the CTE mismatch from being transmitted to the laser. The thickness of the SiC layer should be such that it provides sufficient mechanical support for the laser consistent with minimum thermal resistance.

Since AlN has a relatively high thermal conductivity and its thickness is typically only 10-20 μm, the presence of this AlN buffer layer 100 will not significantly increase the overall thermal resistance. Furthermore, AlN is an electrical insulator, which facilitates metallization for appropriate interconnects for laser mounting. Crack-free SiC wafers with a thin layer of deposited AlN are becoming commercially available.

Our numerical calculations showed that the average active region temperature of a $\lambda=4.6$ μm QCL at threshold driving conditions is ~4 K lower when the laser is mounted on a AlN/SiC submount compared to that when the laser is mounted on an AlN submount. Under laser driving conditions above threshold, this temperature difference increases further and reaches approximately 10 K at laser output roll-over, i.e. maximum output power. Since laser parameters such as threshold current density and slope efficiency improve as temperature is lowered, higher laser performance is expected for lasers mounted on AlN/SiC submounts.

Figure 1:
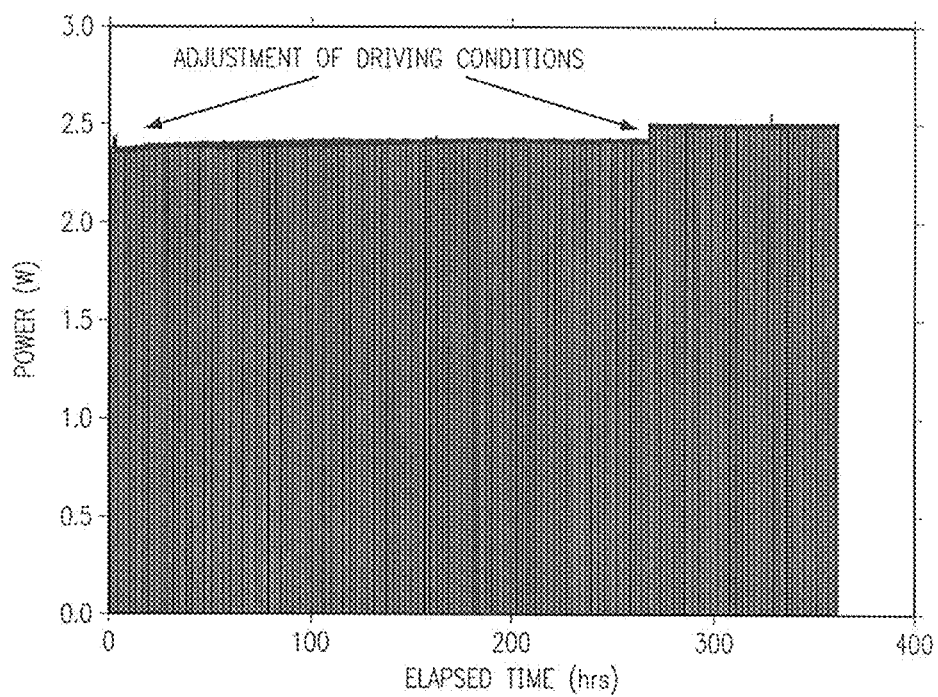
FIG. 1 is a graph showing reliability testing of a high-power, continuous wave, $\lambda$=4.6 µm QCL mounted on an AlN/SiC submount. No signs of laser performance degradation were observed after more than 350 hours of operation.
Figure 2:
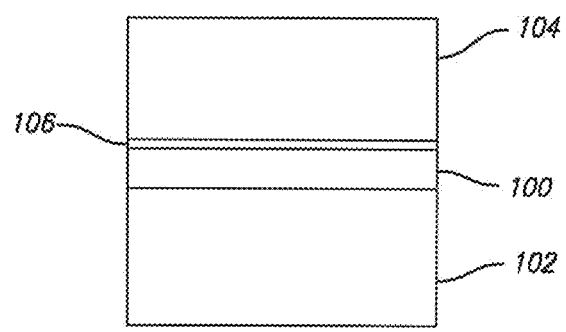
FIG. 2 is a schematic of an AlN/SiC submount bonded to a semiconductor laser according to an embodiment of the invention. Note that the layers are not necessarily shown to scale.

Accordingly, we procured a commercially available AlN (20 μm)/SiC (250 μm) wafer and metalized and patterned it for electrical interconnections and laser bonding. This was followed by deposition of hard solder stripes on top of the metalized surface for laser bonding. As a hard solder 106 we used an AuSn eutectic solder system that does not exhibit electromigration. We then diced the wafer into individual submounts. A schematic of this setup is shown in FIG. 2. After numerous large temperature cycles typical of the laser mounting process (20° C.↔300° C.), we did not observe any visible mechanical damage to the laser mounted on one of the submounts. The laser was then fully packaged and tested for reliability, the results of which are shown in FIG. 1. The reliability test involved periodic power cycles to increase thermal stress on the laser. No signs of performance degradation were observed. During the entire burn-in process the laser delivered record-high ~2.5 W of continuous wave optical power at $\mu=4.6$ μm when operating the QCL in a room temperature environment with air cooling as a method of heat removal. Lasers of the same dimensions, processed from the same laser material and mounted on AlN submounts delivered approximately 2.25 W. Therefore, employment of AlN/SiC submounts led to >10% increase in optical power, consistent with improved thermal management.

In conclusion, AlN/SiC submounts are excellent for high heat density InP-based semiconductor lasers. The AlN layer serves as a buffer that absorbs mechanical stress caused by the residual CTE mismatch between InP laser and SiC. SiC, in turn, has very high thermal conductivity, lowering laser active region temperature under the same laser driving conditions.

While the present invention has been described with regards to particular embodiments, it is recognized that additional variations of the present invention may be devised without departing from the inventive concept. For example, the invention may be applied to diode lasers.

INDUSTRIAL APPLICABILITY

This invention may be industrially applied to the development, manufacture, and use of submounts for InP-based semiconductor lasers and can be extended to other laser material systems as well.

What is claimed is:

1. A mounted quantum cascade laser (QCL) comprising:
   (a) a QCL;
   (b) a substrate comprising a layer of silicon carbide (SiC) with a thickness of 250 μm, and a layer of aluminum nitride (AlN) deposited on the layer of SiC, the layer of AlN having a thickness of 20 μm, the layer of AlN having a metalized area that is metalized and patterned for electrical interconnections and laser bonding; and
   (c) a gold-tin (AuSn) eutectic applied to the metalized area of the AlN layer of the substrate, the AuSn eutectic bonding the substrate to the QCL.

2. A submount for a semiconductor laser, the submount comprising:
   (a) a layer of silicon carbide (SiC) having a thickness;
   (b) a layer of aluminum nitride (AlN) deposited on the layer of SiC, the layer of AlN having a thickness; and
   (c) a hard solder applied to the layer of AlN for bonding to the semiconductor laser.

3. The submount of claim 2, the layer of AlN also having a bonding area that is metalized and patterned for electrical interconnections and laser bonding, wherein the hard solder is applied to the bonding area of the MN layer for bonding to the semiconductor laser.

4. The submount of claim 2, the thickness of the AlN layer being up to ten percent the thickness of the SiC layer.

5. The submount of claim 4, the thickness of the SiC layer being 250 μm.

6. The submount of claim 4, the thickness of the AlN layer being 20 μm.

7. The submount of claim 2, the thickness of the MN layer being up to twenty-five microns, and the thickness of the SiC layer being two hundred fifty microns.

8. The submount of claim 2, the thickness of the AlN layer being twenty microns, and the thickness of the SiC layer being two hundred fifty microns.

9. The submount of claim 2, the hard solder being a gold-tin (AuSn) eutectic.

10. The submount of claim 2, the semiconductor laser being a diode laser.

11. The submount system of claim 2, the semiconductor laser being a quantum cascade laser.

12. A submount system for an indium phosphide (InP) based semiconductor laser, the submount system comprising:
  (a) a submount comprising a layer of silicon carbide (SiC) having a thickness and a layer of aluminum nitride (AlN) deposited on the layer of SiC, the layer of AlN having a thickness; and
  (b) a hard solder applied to the AlN layer, the hard solder bonding the submount to the InP-based semiconductor laser.

13. The submount system of claim 12, the thickness of the AlN layer being up to ten percent the thickness of the SiC layer.

14. The submount system of claim 13, the thickness of the SiC layer being up to 250 μm.

15. The submount system of claim 13, the thickness of the SiC layer being 250 μm.

16. The submount system of claim 13, the thickness of the AlN layer being 20 μm.

17. The submount system of claim 12, the thickness of the AlN layer being up to twenty-five microns, and the thickness of the SiC layer being two hundred fifty microns.

18. The submount system of claim 12, the thickness of the AlN layer being twenty microns, and the thickness of the SiC layer being two hundred fifty microns.

19. The submount system of claim 12, the hard solder being a gold-tin (AuSn) eutectic.

20. The submount system of claim 12, the layer of AlN also having a bonding area that is metalized and patterned for electrical interconnections and laser bonding, wherein the hard solder is applied to the bonding area of the AlN layer for bonding to the semiconductor laser.

21. The submount system of claim 12, the InP-based semiconductor laser being a quantum cascade laser.

22. The submount system of claim 12, the InP-based semiconductor laser being a quantum cascade laser producing more than 2.5 watts of continuous wave optical power at a wavelength of 4.6 microns.

* * * * *